United States Patent
Reinmuth

(10) Patent No.: US 8,756,996 B2
(45) Date of Patent: Jun. 24, 2014

(54) MICROMECHANICAL SYSTEM

(75) Inventor: Jochen Reinmuth, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 395 days.

(21) Appl. No.: 13/134,020

(22) Filed: May 25, 2011

(65) Prior Publication Data

US 2011/0296919 A1    Dec. 8, 2011

(30) Foreign Application Priority Data

Jun. 4, 2010   (DE) .......................... 10 2010 029 708

(51) Int. Cl.
*G01P 15/125*    (2006.01)
*H01L 21/28*    (2006.01)

(52) U.S. Cl.
USPC .......... 73/514.32; 29/592.1; 361/280; 438/50

(58) Field of Classification Search
USPC ............... 73/514.32; 29/592.1; 361/278, 280; 438/50

See application file for complete search history.

(56) References Cited

U.S. PATENT DOCUMENTS

| | | | | |
|---|---|---|---|---|
| 7,075,701 B2 * | 7/2006 | Novotny et al. | ............... | 359/291 |
| 7,466,474 B2 * | 12/2008 | Jung et al. | ..................... | 359/290 |
| 8,413,507 B2 * | 4/2013 | Fujii et al. | .................. | 73/514.32 |

FOREIGN PATENT DOCUMENTS

DE    10 2007 060 878    6/2009

* cited by examiner

*Primary Examiner* — John Chapman, Jr.
(74) *Attorney, Agent, or Firm* — Kenyon & Kenyon LLP

(57) ABSTRACT

In a micromechanical system having a substrate and an electrode situated over the substrate, the electrode is connected to the substrate via a vertical spring. The vertical spring is sectionally provided in a first conductive layer and sectionally provided in a second conductive layer, the second conductive layer being situated over the first conductive layer and the first conductive layer being situated over the substrate. The electrode is provided in a third conductive layer, which is situated over the second conductive layer.

9 Claims, 10 Drawing Sheets

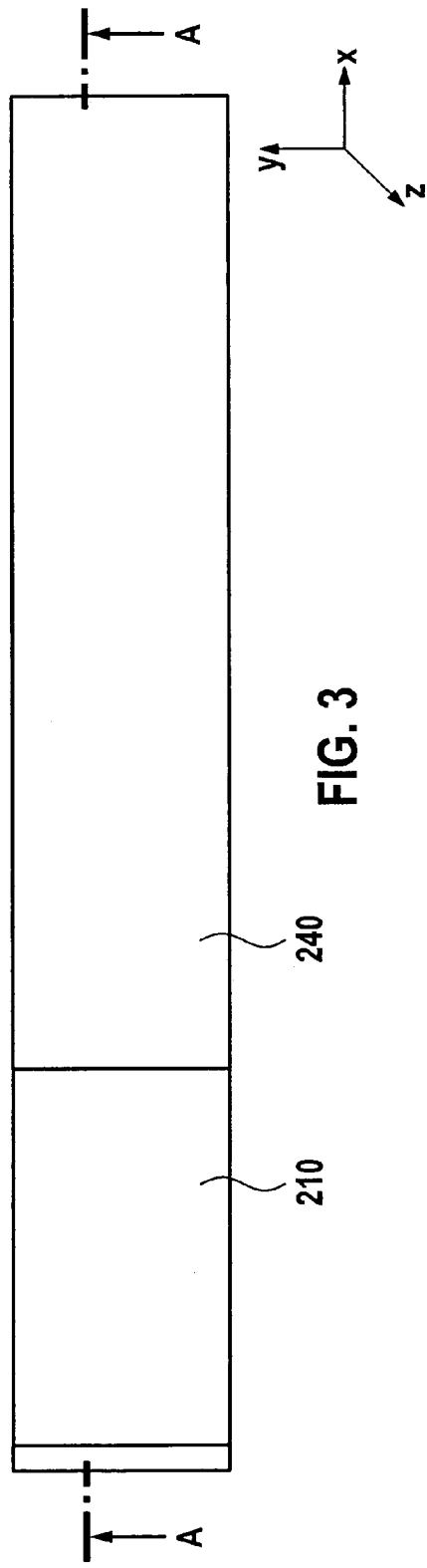
FIG. 3
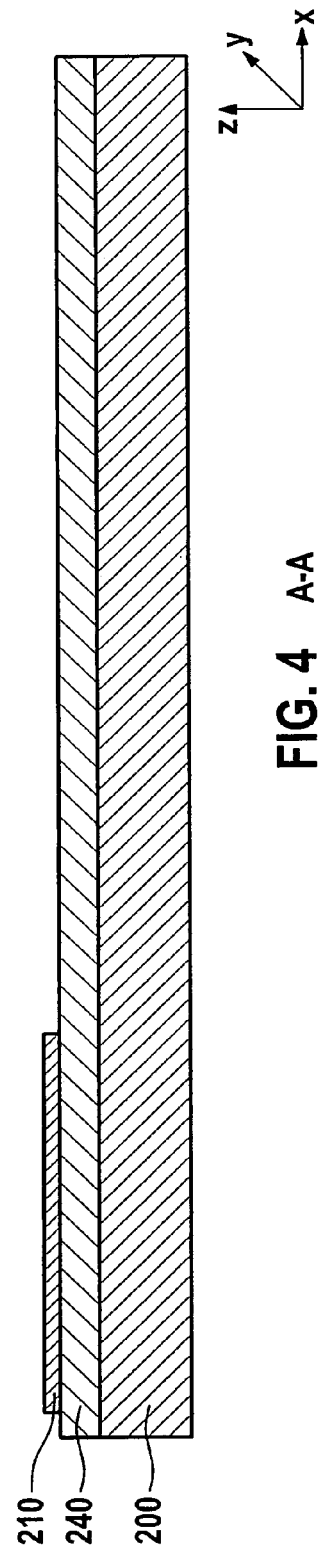
FIG. 4 A-A

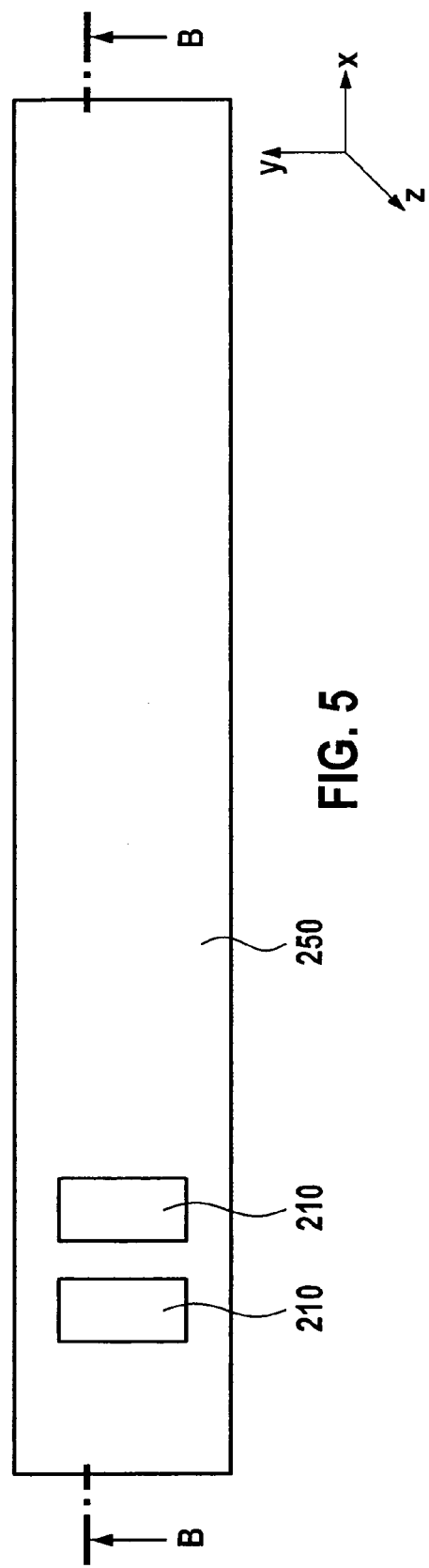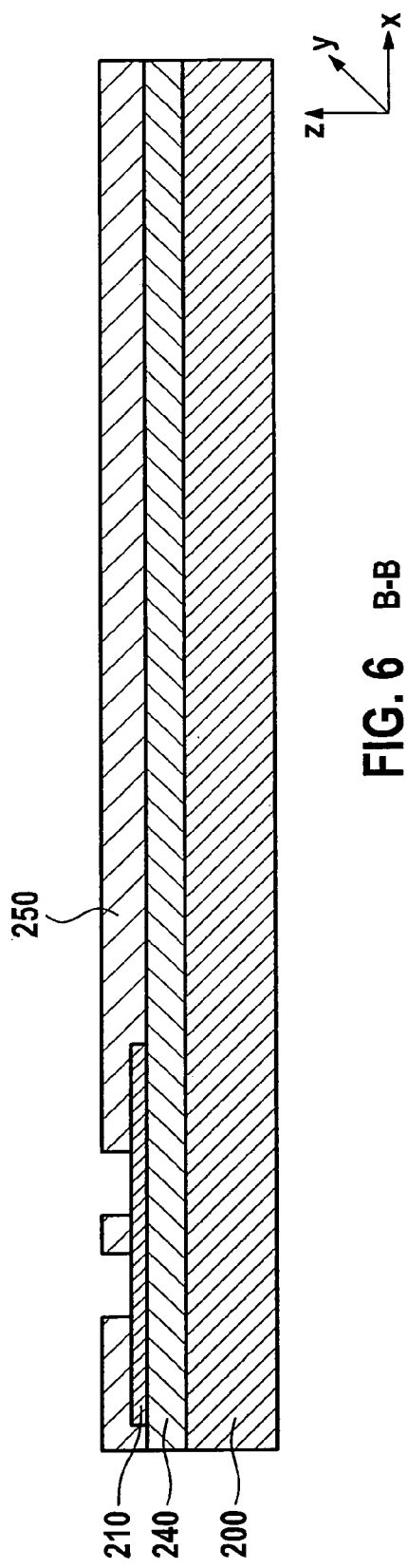

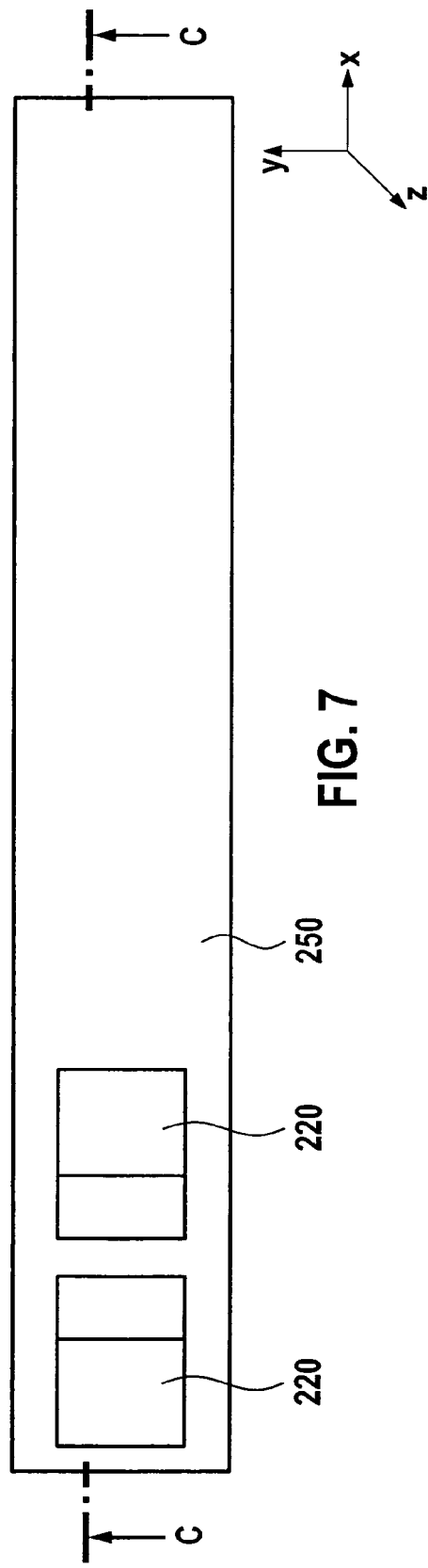
FIG. 7
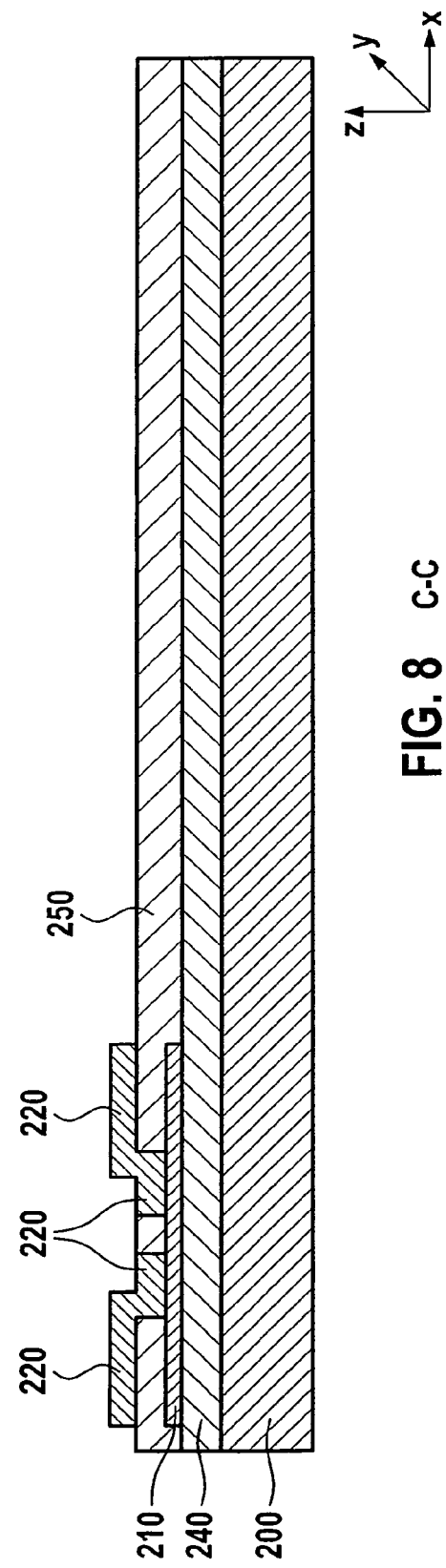
FIG. 8  C-C

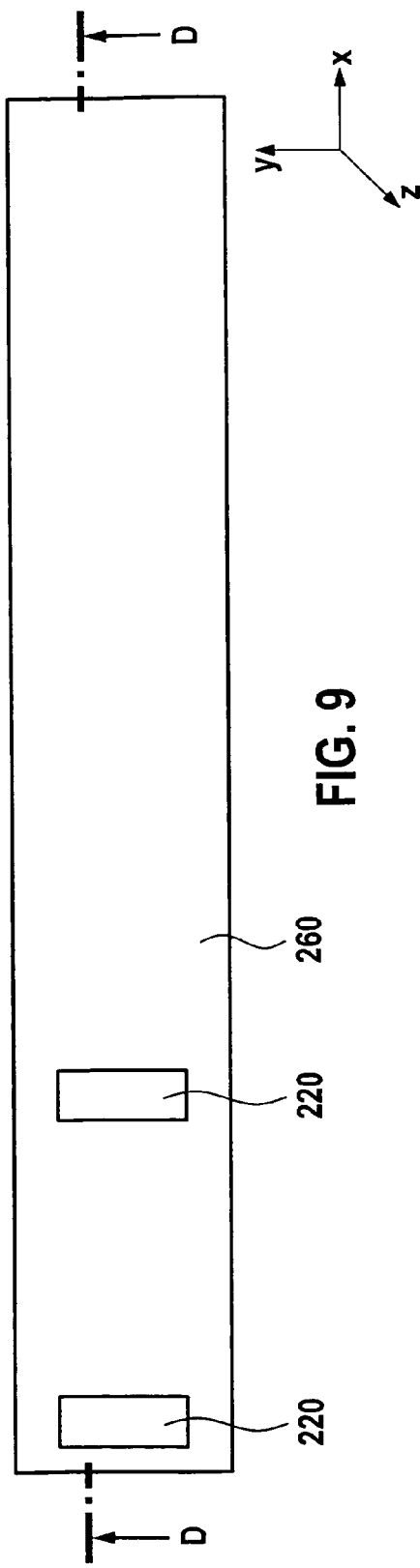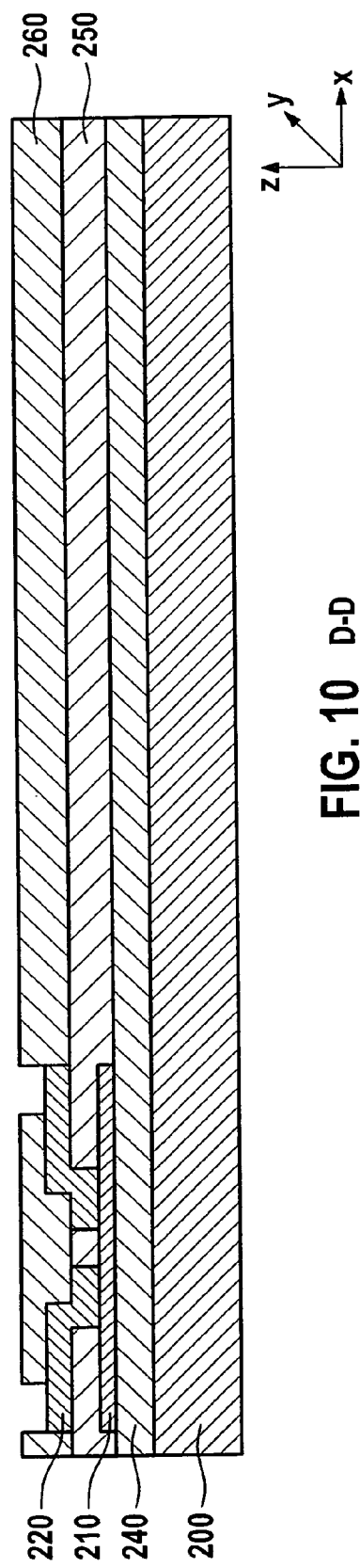

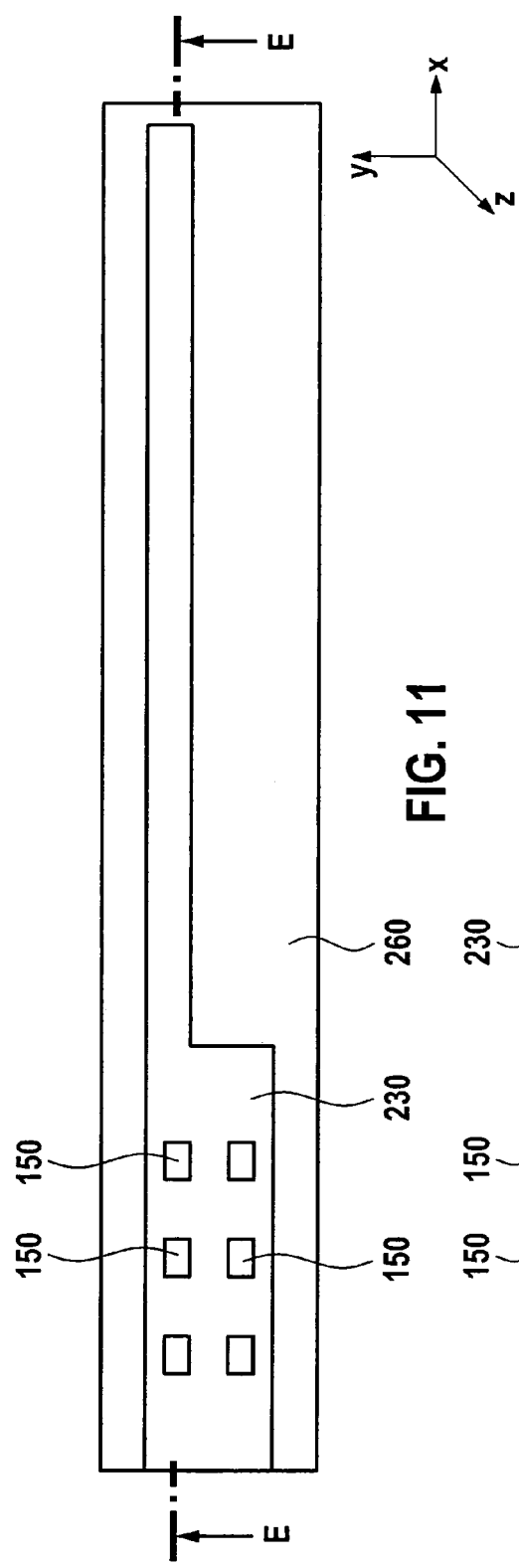
FIG. 11
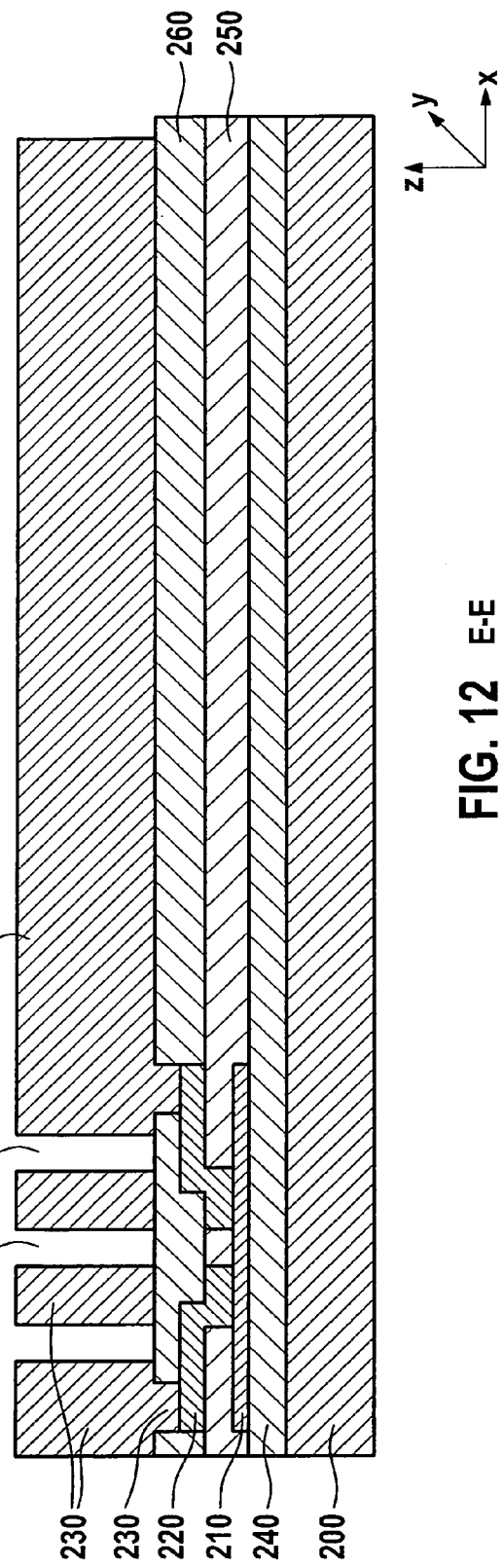
FIG. 12 E-E

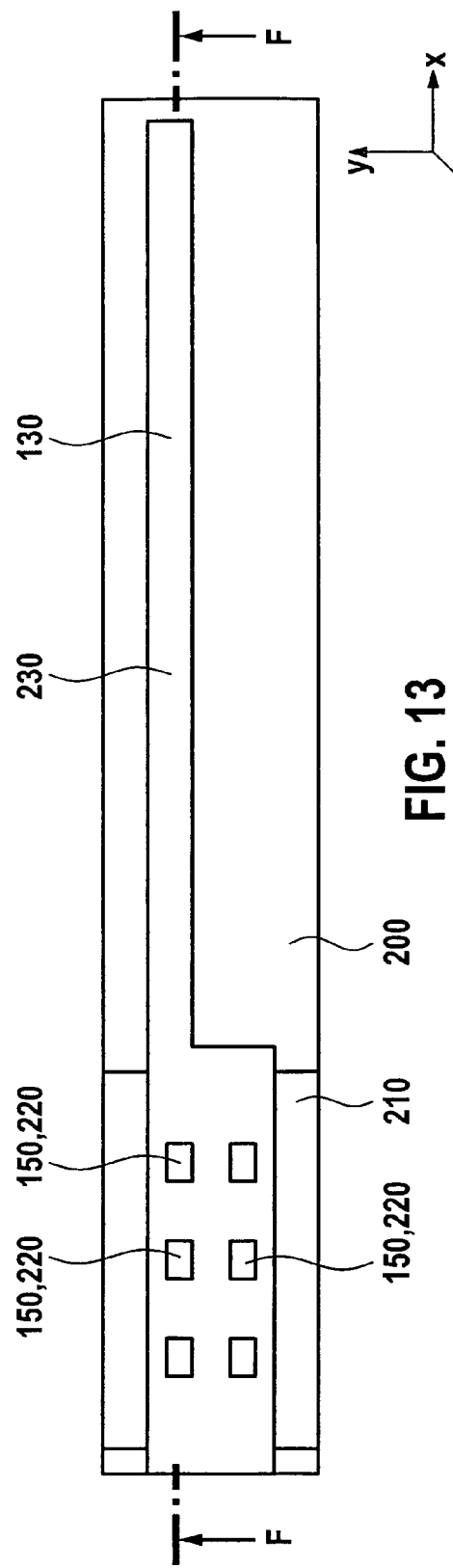
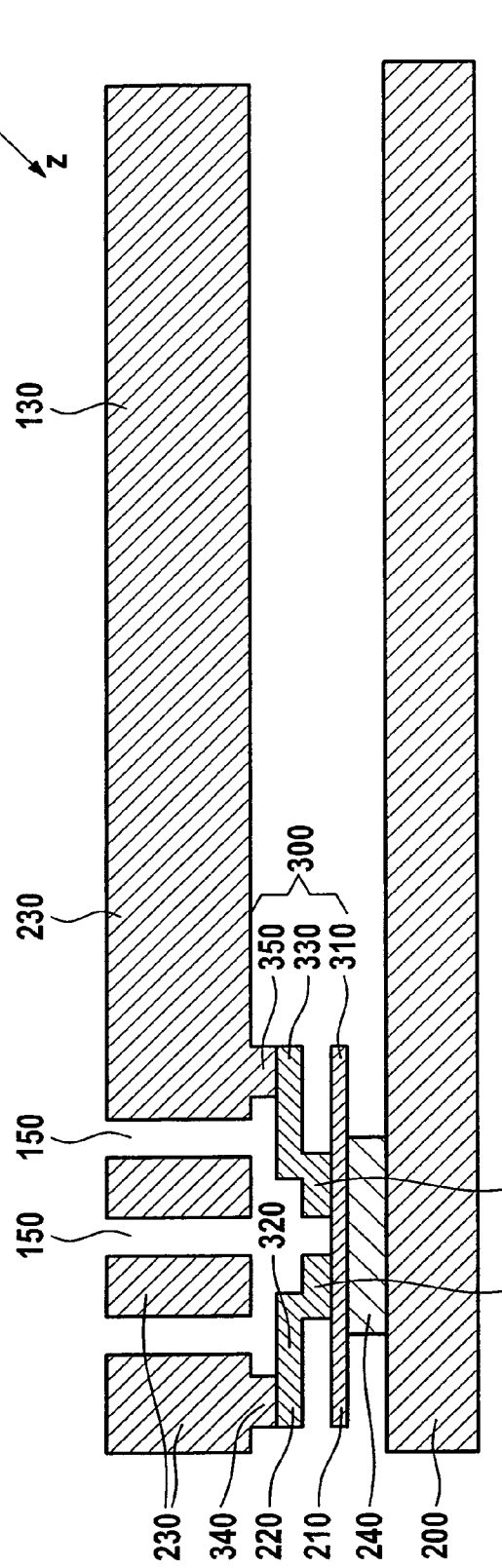

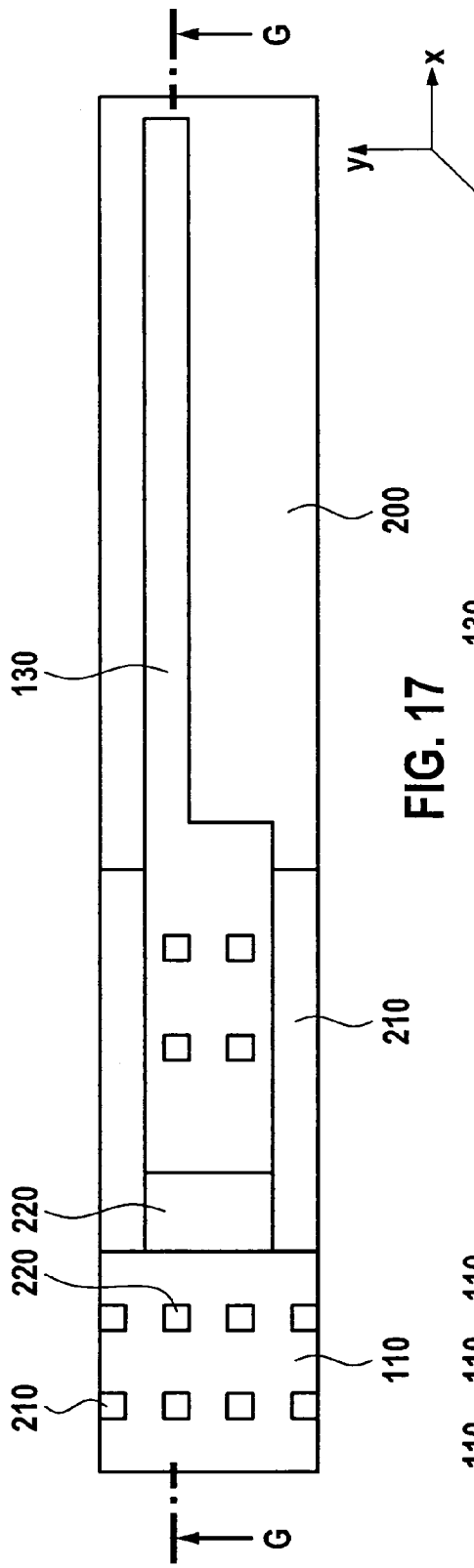
FIG. 17
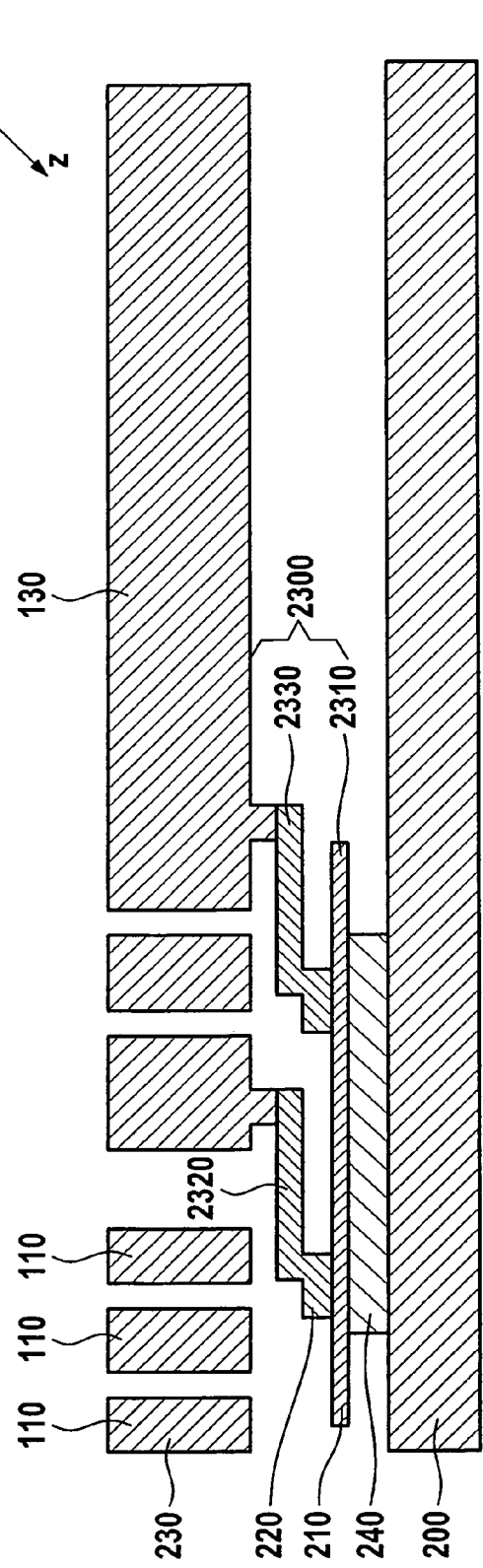
FIG. 18 G-G

MICROMECHANICAL SYSTEM

BACKGROUND OF THE INVENTION

1. Field of the Invention

The present invention relates to a micromechanical system and a method for manufacturing a micromechanical system.

2. Description of the Related Art

Micromechanical structures (MEMS structures) have manifold uses in the related art, for example, as X and Y acceleration sensors. Such micromechanical systems have a movable element, which is connected via at least one spring element to a substrate. The movable element has electrode fingers, which are adjacent to electrodes connected fixedly to the substrate. An acceleration, which acts on the acceleration sensor, results in a deflection of the movable element, whereby an electrical capacitance between the electrode fingers and the fixed electrodes changes. This capacitance change represents a measure of the magnitude of the acting acceleration.

Applying a thick polysilicon functional layer to a thin buried polysilicon layer on a substrate is known for manufacturing such micromechanical structures. The movable element and the fixed electrodes are manufactured from the functional layer, while the thin layer is used to manufacture printed conductors. In addition, providing a second buried polysilicon layer between the functional layer and the buried polysilicon layer is known from German patent application document DE 102007060878.2.

The fixed electrodes which are manufactured from the functional layer are typically connected in a partial area to the thin polysilicon layer lying underneath. It is desirable to use the thickest possible functional layer, in order to achieve large electrical capacitances. However, the stability of the anchoring of the fixed electrodes decreases with increasing thickness of the functional layer. Excessively large accelerations acting on the micromechanical system could result in breaking off of the fixed electrodes.

BRIEF SUMMARY OF THE INVENTION

An object of the present invention is therefore to provide an improved micromechanical system and to provide an improved method for manufacturing a micromechanical system.

A micromechanical system according to the present invention includes a substrate and an electrode, which is situated over the substrate, and which is connected to the substrate via a vertical spring. The vertical spring is sectionally designed in a first conductive layer and sectionally designed in a second conductive layer, the second conductive layer being situated over the first conductive layer and the first conductive layer being situated over the substrate. In addition, the electrode is designed in a third conductive layer, which is situated over the second conductive layer. Such a flexible spring attachment of the electrode on the substrate advantageously also allows the use of very thick electrodes. The hardness and breaking force of the vertical spring may be set via the design of the spring. The suspension of the electrode using the vertical spring does not require more space than typical suspensions. It is also advantageous that the vertical spring may be implemented simply and without large changes in existing process sequences. The micromechanical system is significantly more stable in relation to external influences due to the use of the vertical spring.

The vertical spring preferably includes a first spring arm and a second spring arm. The first spring arm is connected at a first upper fastening point to the electrode and at a first lower fastening point to a base. The second spring arm is accordingly connected at a second upper fastening point to the electrode and at a second lower fastening point to the base. The base is designed in the first conductive layer, while the spring arms are designed in the second conductive layer. This embodiment of the vertical spring advantageously allows a stable suspension of the electrode while requiring little space.

An insulation layer is preferably situated below the base in a direction perpendicular to the substrate below the lower fastening points. Otherwise, a voltage overload, which could result in damage to the vertical spring, would occur in the area of the lower fastening points in the case of a load on the vertical spring.

According to a specific embodiment of the micromechanical system, the lower fastening points have a smaller distance to one another than the upper fastening points. This advantageously allows a particularly space-saving configuration.

According to another specific embodiment of the micromechanical system, the spring arms are oriented approximately parallel to one another and pointing in the same direction and each has approximately the same length. Through this design of the vertical spring, mechanical properties of the individual conductive layers which differ from one another, for example, differing intrinsic stress or differing coefficients of thermal expansion, may advantageously be compensated for, since they do not result in tensions or bending in the proposed embodiment of the vertical spring.

In this specific embodiment, at least one of the lower fastening points is particularly preferably situated below a movable element of the micromechanical system in a direction perpendicular to the substrate. The size and therefore the stability of the vertical spring may then advantageously be increased, without simultaneously increasing the space required for the vertical spring.

Alternatively, the vertical spring may be situated completely below the electrode in a direction perpendicular to the substrate, whereby good space utilization is also ensured.

In a refinement of the micromechanical system, a central spring arm, which is oriented essentially perpendicularly to the substrate, is situated between the first spring arm and the second spring arm. A high stiffness of the vertical spring with respect to rotations around a direction perpendicular to the substrate surface is thus advantageously achieved, while rotation around an axis parallel to the substrate surface may occur around the central spring arm.

A stop which is spaced apart from the electrode and is connected to the substrate is preferably provided below the electrode, and limits a possible deflection of the electrode. A defined stop of the electrode on the stop is thus advantageously ensured if a large acceleration acts on the micromechanical system.

The micromechanical system preferably also has a movable element which is connected to the substrate via a spring element. The vertical spring has a higher stiffness than the spring element. It is thus ensured that an acceleration, which corresponds to typical operating conditions in a first approximation, only results in a deflection of the movable element, but not the electrode.

A method according to the present invention for manufacturing a micromechanical system having a substrate and an electrode situated over the substrate has steps for depositing a first insulation layer on a substrate, for depositing and structuring a first conductive layer, a base of the vertical spring being created, for depositing and structuring a second insulation layer, for depositing and structuring a second conductive layer, at least one spring arm of the vertical spring being created, for depositing and structuring a third insulation layer, for depositing and structuring a third conductive layer, the electrode being created, which is connected to the substrate via the vertical spring, and for detaching a part of the first insulation layer, the second insulation layer, and the third insulation layer. This method advantageously allows the manufacture of a micromechanical system having the above-mentioned advantageous properties. A further advantage is that the method according to the present invention only requires slight alterations in existing process sequences.

BRIEF DESCRIPTION OF THE DRAWINGS

FIGS. 3 through 13 show processing steps during the manufacture of the micromechanical system.

FIG. 14 shows a section through a micromechanical system according to a first example embodiment.

FIG. 17 shows a top view of a micromechanical system according to a fourth example embodiment.

FIG. 18 shows a section through the micromechanical system according to the fourth example embodiment.

DETAILED DESCRIPTION OF THE INVENTION

The present invention is explained hereafter on the basis of various example embodiments of a micromechanical acceleration sensor. This illustration is only exemplary, however. The present invention may also be applied to other micromechanical systems.

Figure 1:
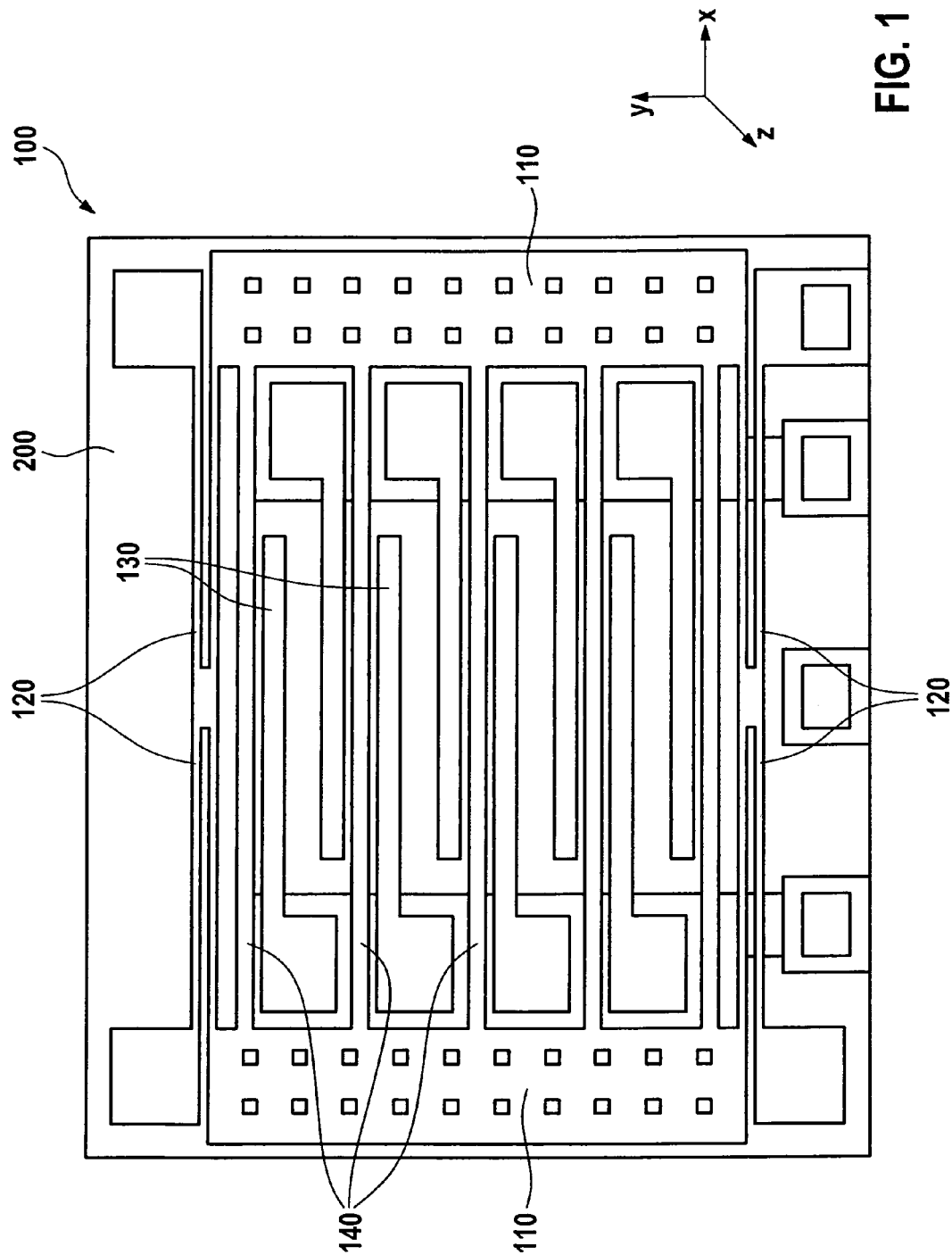
FIG. 1 shows a top view of a micromechanical system.

FIG. 1 shows a schematic top view of a micromechanical system 100. Micromechanical system 100 is implemented in the z direction above a substrate 200 in an x-y plane. The substrate may be a silicon substrate, for example.

Micromechanical system 100 of FIG. 1 is an acceleration sensor for detecting accelerations acting in the y direction. Micromechanical system 100 has a movable element 110, which is connected to substrate 200 via spring elements 120 and is deflectable by externally acting accelerations against the resistance of spring elements 120 in the y direction.

Movable element 110 has multiple movable electrodes 140, which are rigidly connected to movable element 110. Adjacent to movable electrodes 140, micromechanical system 100 has multiple fixed electrodes 130, which are connected essentially rigidly to substrate 200. Both fixed electrodes 130 and also movable electrodes 140 are electrically conductive and are connected to an electrical circuit. An electrical capacitance, whose magnitude is a function of the distance of movable electrodes 140 from fixed electrodes 130, exists between fixed electrodes 130 and movable electrodes 140. A deflection of movable element 110 which is caused by an external acceleration acting on micromechanical system 100 results in a change of this electrical capacitance, which is detectable using the electrical circuit and represents a measure of the magnitude of the acceleration.

Fixed electrodes 130 are implemented as elongated and pointing in the x direction in the x-y plane and are only connected to the substrate on one side. In the related art, this connection is implemented as rigid in such a way that typically occurring accelerations only result in a minimal deflection of fixed electrodes 130. However, it has been shown that excessively large external accelerations may result in breaking off of fixed electrodes 130. Fixed electrodes 130 of micromechanical system 100 therefore have an improved suspension according to the present invention, which is described hereafter.

Figure 2:
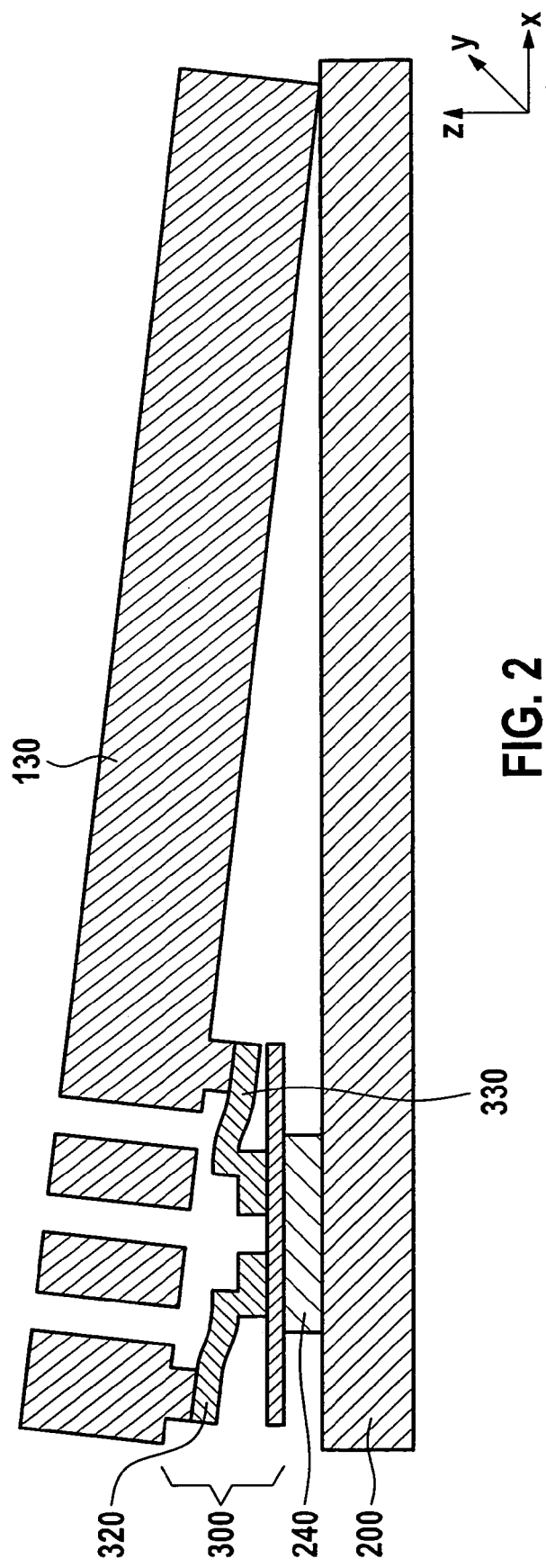
FIG. 2 shows a schematic sectional view of a fixed electrode suspended using a vertical spring.

FIG. 2 shows a section parallel to the x-z plane through one of fixed electrodes 130. Electrode 130 is shown under the influence of an acceleration acting in the z direction. Electrode 130 is implemented as an elongated bar pointing in the x direction, which is connected on one side via a vertical spring 300 and a first insulation layer 240 to substrate 200, which lies underneath in the z direction. Vertical spring 300 has a first spring arm 320 and a second spring arm 330. The schematic view of FIG. 2 shows that spring arms 320, 330 of vertical spring 300 are designed as elastic in such a way that electrode 130 may tilt around a rotational axis parallel to the y axis, without vertical spring 300 thus being damaged. In the view of FIG. 2, electrode 130 is tilted far enough that the end of electrode 130 facing away from vertical spring 300 touches substrate 200.

The manufacture of micromechanical system 100 having vertical spring 300 is explained hereafter.

FIG. 3 shows a schematic top view of substrate 200 in the x-y plane. FIG. 4 shows a section parallel to the x-z plane through substrate 200 in the same processing state as in FIG. 3. Firstly, a first insulation layer 240 has been applied to substrate 200. First insulation layer 240 is electrically insulating and is used in a subsequent processing step as a sacrificial layer. Insulation layer 240 may have an oxide, such as a silicon oxide, for example. First insulation layer 240 may be deposited using methods known from the related art.

A first conductive layer 210 is deposited on first insulation layer 240. Subsequently, first conductive layer 210 is structured in such a way that it only remains on first insulation layer 240 in a few areas in the x-y plane. First conductive layer 210 may be deposited and structured using methods known from the related art. First conductive layer 210 is made of a conductive material, for example, doped polycrystalline silicon. First conductive layer 210 is used to produce a base of vertical spring 300 and may also be used in other areas of micromechanical system 100 to produce printed conductors and electrodes. First conductive layer 210 may therefore also be referred to as a printed conductor plane or as a buried printed conductor plane.

FIG. 5 shows a top view of substrate 200 in a second processing state. FIG. 6 shows a section through substrate 200 in the same processing state. A second insulation layer 250 has been applied to first insulation layer 240 and first conductive layer 210. In addition, second insulation layer 250 was structured in such a way that first conductive layer 210 was exposed in two areas in the z direction above remaining first conductive layer 210. Like first insulation layer 240, second insulation layer 250 is made of an electrically insulating material and is also used in a subsequent processing step as a sacrificial layer. Second insulation layer 250 may also be made of an oxide, for example. Second insulation layer 250 may be deposited and structured using methods known from the related art.

FIG. 7 shows a top view of substrate 200 in a further processing state. FIG. 8 shows a section through substrate 200 in the same processing state. A second conductive layer 220 was applied to second insulation layer 250 and the exposed areas of first conductive layer 210. Second conductive layer 220 was subsequently structured in such a way that second conductive layer 220 only remains in two sections in the illustrated area of substrate 200, which are situated above the remaining areas of first conductive layer 210 in the z direction. Second conductive layer 220 may be deposited and structured using methods known from the related art. Second conductive layer 220 is made of an electrically conductive material, for example, doped polycrystalline silicon. During the manufacture of vertical spring 300, second conductive layer 220 is used to form spring arms. In remaining areas of micromechanical system 100, second conductive layer 220 may also be used to produce printed conductors and electrodes. For this reason, second conductive layer 220 may also be referred to as the second buried printed conductor plane.

FIG. 9 shows a top view of substrate 200 in a further processing state. FIG. 10 shows a section through substrate 200 in the same processing state. A third insulation layer 260 was applied and structured in such a way that the areas of second conductive layer 220 applied in the preceding work step were partially exposed. Third insulation layer 260 is made of an electrically insulating material and is used as a sacrificial layer in a subsequent processing step. Third insulation layer 260 may be made of an oxide, for example. Third insulation layer 260 may be deposited and structured using methods known from the related art.

FIG. 11 shows a top view of substrate 200 in a further processing state. FIG. 12 shows a section through substrate 200 in the same processing state. A third conductive layer 230 was applied to third insulation layer 260 and the exposed areas of second conductive layer 220. In addition, third conductive layer 230 was structured in such a way that third conductive layer 230 only remains in the x-y plane in the area of resulting fixed electrode 130. Third conductive layer 230 may be deposited and structured using methods known from the related art. In addition, multiple vertical trenches 150 were created, which run from the surface of third conductive layer 230 through third conductive layer 230 up to third insulation layer 260 lying underneath. Third conductive layer 230 is made of an electrically conductive material, for example, doped polycrystalline silicon. Since functional elements of micromechanical system 100 were produced from third conductive layer 260, third conductive layer 260 may also be referred to as a functional layer. Third conductive layer 230 has a greater thickness in the z direction than first conductive layer 210 and second conductive layer 220. Third conductive layer 230 may also be designed as just as thin or even thinner than conductive layers 210, 220 lying underneath, however.

FIG. 13 shows a top view of finished processed fixed electrode 130 after a further processing step. FIG. 14 shows a section through finished processed fixed electrode 130. Parts of first insulation layer 240, second insulation layer 250, and third insulation layer 260 were removed using a sacrificial layer process. The sacrificial layer process may be performed using means known from the related art, for example, using an etching procedure. The etching medium penetrates through previously created trenches 150 to the areas of insulation layers 240, 250, 260. Insulation layers 240, 250, 260 were removed in such a way that, in the area of fixed electrode 130, only a section of first insulation layer 240 situated under vertical spring 300 remains, which connects the vertical spring to substrate 200 lying underneath. Second insulation layer 250 and third insulation layer 260 were completely removed in such a way that vertical spring 300 and fixed electrode 130 are completely exposed.

In the specific embodiment shown in FIG. 14, vertical spring 300 has a base 310, which is produced from first conductive layer 210. A part of first insulation layer 240, which connects base 310 to substrate 200, remains in the z direction below base 310. In the z direction above base 310, vertical spring 300 has first spring arm 320 and second spring arm 330. First spring arm 320 is connected at a first lower fastening point 360 to the base and at a first upper fastening point 340 to fixed electrode 130. Second spring arm 330 is connected at a second lower fastening point 370 to base 310 and at a second upper fastening point 350 to fixed electrode 130. Spring arms 320, 330 are essentially produced from second conductive layer 220. Lower fastening points 360, 370 are produced at the transition between first conductive layer 210 and second conductive layer 220. Upper fastening points 340, 350 are produced at the transition between second conductive layer 220 and third conductive layer 230.

In the specific embodiment shown in FIG. 14, spring arms 320, 330 are situated in a V-shape in the x direction. Therefore, lower fastening points 360, 370 are closer to one another in the x direction than upper fastening points 340, 350. In the y direction, vertical spring 300 may be extended over the entire width of fixed electrode 130 with uniform cross-section. The remainder of first insulation layer 240, which remains in the z direction below base 310, is expanded in the x direction in such a manner that first insulation layer 240 is situated completely under lower fastening points 360, 370 in the x direction. Therefore, an area of first insulation layer 240 still remains in the z direction vertically below fastening points 360, 370. Otherwise, it would be a concern that an edge having excessive tension could arise in the area of lower fastening points 360, 370, which may result in tearing off of vertical spring 300. The V-shaped arrangement of spring arms 320, 330 has the advantage that the remaining area of first insulation layer 240 may be selected as very small.

Figure 15:
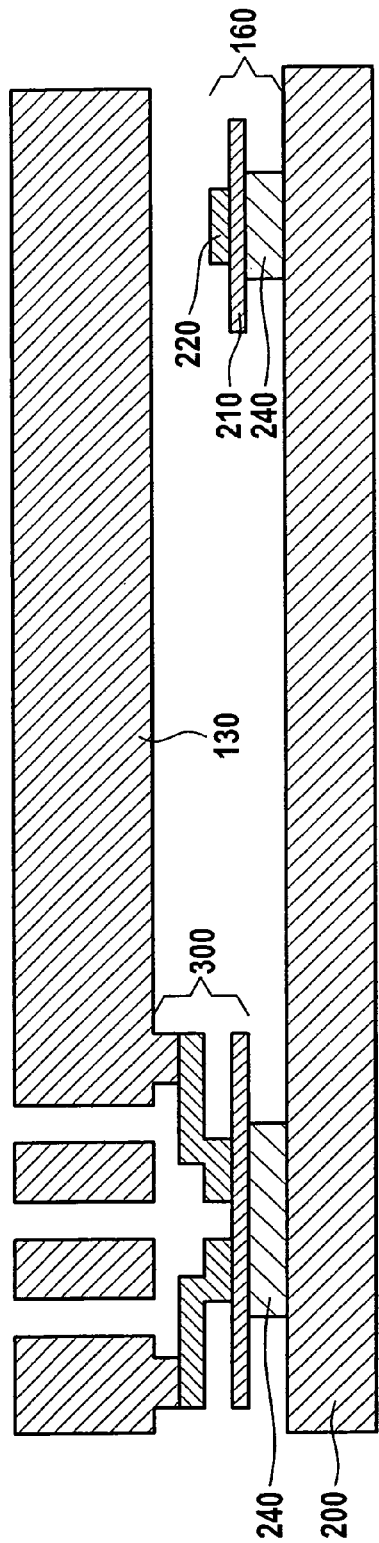
FIG. 15 shows a section through a micromechanical system according to a second example embodiment.

FIG. 15 shows a section through fixed electrode 130 of micromechanical system 100 according to a second embodiment. In this embodiment, a stop 160 is provided, which is situated in the z direction below the free end of fixed electrode 130, i.e., in the x direction at the end of fixed electrode 130 opposite to vertical spring 300. Stop 160 has a round or rectangular contour in the x-y plane, for example. In the z direction, stop 160 includes an area of first insulation layer 240, an area of first conductive layer 210, and an area of second conductive layer 220. Stop 160 may be manufactured simultaneously with fixed electrode 130. Stop 160 is used for the purpose of limiting tilting of fixed electrode 130, which is made possible by vertical spring 300, under the influence of a large external acceleration. Even very large external accelerations only tilt fixed electrode 130 until fixed electrode 130 stops on stop 160. Possible damage of fixed electrode 130 and vertical spring 300 is prevented by this defined stop.

Figure 16:
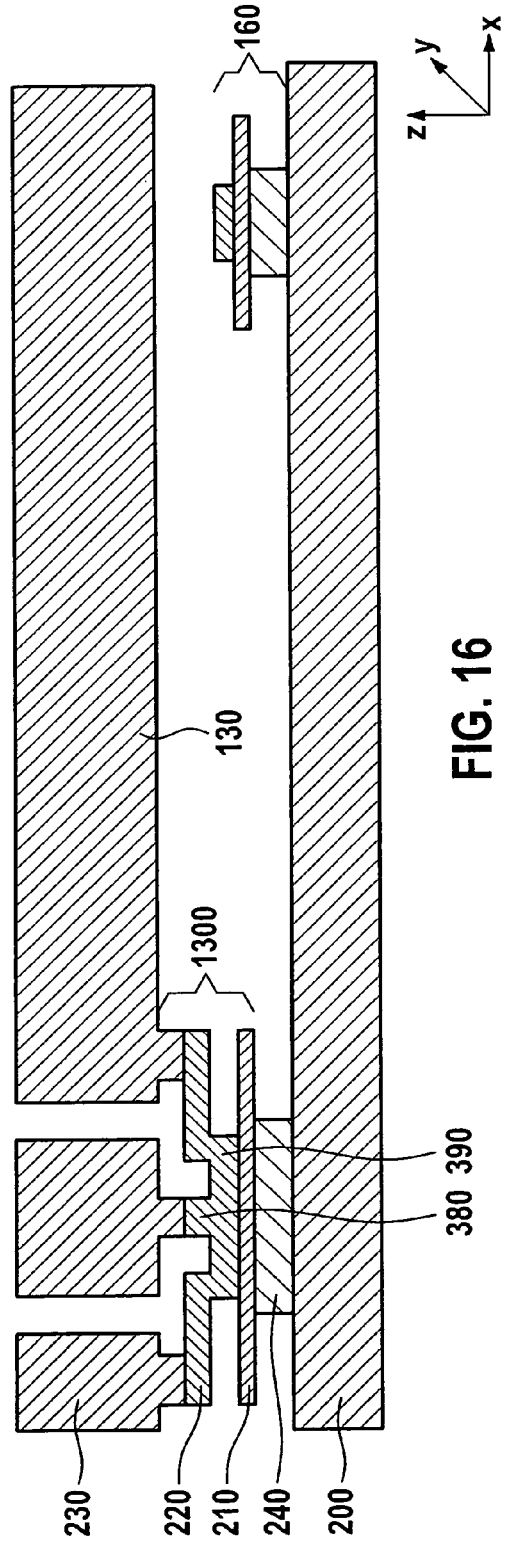
FIG. 16 shows a section through a micromechanical system according to a third example embodiment.

FIG. 16 shows a section through a further specific embodiment of a fixed electrode 130 of a micromechanical system 100. In the specific embodiment of FIG. 16, vertical spring 300 was replaced by a vertical spring 1300. Vertical spring 1300 differs from the preceding specific embodiments in that it has a central spring arm 380 in addition to the spring arms situated in a V-shape. This central spring arm 380 runs parallel to the z direction, i.e., perpendicular to the surface of substrate 200 between the base of vertical spring 1300 and fixed electrode 130. The central spring arm is designed as bar-shaped in the y direction. The spring arms situated in a V-shape and central spring arm 380 are connected to base 210 at a common lower fastening point 390. A high stiffness of fixed electrode 130 in the short direction of fixed electrode 130 is ensured by central spring arm 380. A rotation around a rotational axis parallel to the y axis may occur around central spring arm 380, but central spring arm 380 does not offer spring action in the z direction and does not permit rotation around a rotational axis parallel to the z direction.

FIG. 17 shows a top view of a fixed electrode 130 of a micromechanical system 100 according to a further specific embodiment. FIG. 18 shows a section through fixed electrode 130 of this specific embodiment. In comparison to the specific embodiment of FIGS. 13 and 14, vertical spring 300 was replaced by a vertical spring 2300. Vertical spring 2300 also includes a first spring arm 2320 and a second spring arm 2330. Spring arms 2320, 2330 are oriented approximately parallel to one another, however. Spring arms 2320, 2330 run between a base 2310, which is produced from first conductive layer 210, and fixed electrode 130, which is produced from third conductive layer 230. A remainder of first insulation layer 240 remains between base 2310 and substrate 200, and is extended in such a way that first insulation layer 240 is situated completely under the transition points between base 2310 and spring arms 2320, 2330 in the direction perpendicular to substrate 200. The occurrence of an edge having excessive tension is thus again prevented.

Due to the parallel arrangement of spring arms 2320, 2330, the transition between first spring arm 2320 and base 2310, in contrast to the specific embodiment of FIGS. 13 and 14, is not situated under fixed electrode 130, but rather under movable element 110 in the direction perpendicular to substrate 200. The otherwise unused space below movable element 110 is thus used. This arrangement also simultaneously allows an enlargement of vertical spring 2300, which allows a higher stability of spring 2300.

The parallel orientation of spring arms 2320, 2330 offers the further advantage that tensions or bending of fixed electrode 130 are avoided. If second conductive layer 220, which is used to produce vertical spring 2300, and third conductive layer 230, which is used to produce fixed electrode 130, have different mechanical properties, for example, differing intrinsic stress or differing coefficients of thermal expansion, the effects of these different mechanical properties are minimized by the parallel orientation in the same direction of spring arms 2320, 2330 and the approximately equal length of both spring arms 2320, 2330.

What is claimed is:

1. A micromechanical system, comprising:
   a substrate;
   an electrode situated over the substrate; and
   a vertical spring that rotates about an axis parallel to the substrate, wherein the electrode is connected to the substrate via the vertical spring; wherein a first portion of the vertical spring is sectionally provided in a first conductive layer and a second portion of the vertical spring is sectionally provided in a second conductive layer, the second conductive layer being situated over the first conductive layer, and the first conductive layer being situated over the substrate, and wherein the electrode is provided in a third conductive layer situated over the second conductive layer, wherein the vertical spring includes a first spring arm and a second spring arm provided in the second conductive layer; the first spring arm is connected at a first upper fastening point to the electrode and connected at a first lower fastening point to a base provided in the first conductive layer; and the second spring arm is connected at a second upper fastening point to the electrode and connected at a second lower fastening point to the base, wherein the first and second upper fastening points are in a different plane than the first and second lower fastening points.

2. The micromechanical system as recited in claim 1, further comprising: an insulation layer situated below the base and below the first and second lower fastening points.

3. The micromechanical system as recited in claim 1, wherein the distance between the first and second lower fastening points is smaller than the distance between the first and second upper fastening points.

4. The micromechanical system as recited in claim 1, wherein the first and second spring arms are oriented approximately parallel to one another in the same direction and have approximately the same length.

5. The micromechanical system as recited in claim 4, wherein at least one of the first and second lower fastening points is situated below a movable element of the micromechanical system in a direction perpendicular to the substrate.

6. The micromechanical system as recited in claim 1, wherein the vertical spring further includes a central spring arm oriented essentially perpendicularly to the substrate and situated between the first spring arm and the second spring arm.

7. The micromechanical system as recited in claim 1, further comprising: a stop provided below the electrode, wherein the stop is spaced apart from the electrode and connected to the substrate, and wherein the stop is positioned to limit a deflection of the electrode.

8. The micromechanical system as recited in claim 1, wherein a movable element of the micromechanical system is connected to the substrate via a further spring element, and wherein the vertical spring has a higher stiffness than the further spring element.

9. A method for manufacturing a micromechanical system having an electrode situated over a substrate, comprising:
   depositing a first insulation layer on the substrate;
   depositing and structuring a first conductive layer to create a base of a vertical spring capable of rotating about an axis parallel to the substrate;
   depositing and structuring a second insulation layer;
   depositing and structuring a second conductive layer to create a first spring arm and a second spring arm of the vertical spring;
   depositing and structuring a third insulation layer;
   depositing and structuring a third conductive layer to create the electrode, which is connected to the substrate via the vertical spring; and
   removing a part of the first insulation layer, the second insulation layer, and the third insulation layer, wherein the first spring arm is connected at a first upper fastening point to the electrode and connected at a first lower fastening point to the base provided in the first conductive layer; and the second spring arm is connected at a second upper fastening point to the electrode and connected at a second lower fastening point to the base, wherein the first and second upper fastening points are in a different plane than the first and second lower fastening points.

\* \* \* \* \*